United States Patent [19]

Nakahashi et al.

[11] Patent Number: 5,056,702
[45] Date of Patent: * Oct. 15, 1991

[54] METHOD OF MANUFACTURING A SEMICONDUCTOR DEVICE

[75] Inventors: Masako Nakahashi; Makoto Shirokane; Hiromitsu Takeda; Tatsuo Yamazaki, all of Tokyo; Tsutomu Okutomi, Yokohama; Shozi Niwa, Sagamihara; Mikio Okawa, Tama; Mitsutaka Homma, Fuchu; Seiichi Suenaga; Shigeru Miyakawa, both of Yokohama, all of Japan

[73] Assignee: Kabushiki Kaisha Toshiba, Kawasaki, Japan

[ * ] Notice: The portion of the term of this patent subsequent to Apr. 17, 2007 has been disclaimed.

[21] Appl. No.: 419,029

[22] Filed: Oct. 10, 1989

Related U.S. Application Data

[63] Continuation-in-part of Ser. No. 176,752, Apr. 1, 1988, Pat. No. 4,917,642.

[30] Foreign Application Priority Data

Apr. 2, 1987 [JP] Japan .................................. 62-79618
Jul. 13, 1987 [JP] Japan ................................. 62-172843
Jul. 13, 1987 [JP] Japan ................................. 62-172845
Mar. 4, 1988 [JP] Japan ................................... 63-49758

[51] Int. Cl.$^5$ ........................................... H01L 23/08
[52] U.S. Cl. ................................... 228/123; 228/124; 228/263.12; 29/841; 437/218
[58] Field of Search ............... 228/122, 123, 124, 179, 228/263.12; 29/841, 855; 437/218

[56] References Cited

U.S. PATENT DOCUMENTS

| | | | |
|---|---|---|---|
| 3,063,144 | 11/1962 | Palmour, III | 228/124 |
| 3,339,267 | 9/1967 | Bronnes et al. | 228/124 |
| 3,371,406 | 3/1968 | Bronnes et al. | 228/124 |
| 3,487,536 | 1/1970 | Goldstein | 228/124 |
| 4,098,452 | 7/1978 | Webster et al. | 228/123 |
| 4,611,745 | 9/1986 | Nakahashi et al. | 228/122 |
| 4,630,767 | 1/1986 | Mizuhara | 228/122 |
| 4,667,871 | 5/1987 | Mizuhara | 228/122 |
| 4,729,504 | 3/1988 | Edamura | 228/122 |
| 4,917,642 | 4/1990 | Nakahashi et al. | 228/122 |

OTHER PUBLICATIONS

Welding Journal, "Ceramic-to-Metal Joining with Active Brazing Filler Metal", pp. 27–32, Oct. 1985.

Primary Examiner—Samuel M. Heinrich
Attorney, Agent, or Firm—Oblon, Spivak, McClelland, Maier & Neustadt

[57] ABSTRACT

A method of manufacturing a semiconductor device comprising a ceramics cylinder, a metal seal member closing an open end of the cylinder, a semiconductor element located within the cylinder and having electrodes, and leads or electrodes connected to the electrodes of the semiconductor element and extending from the cylinder. The method comprises the steps of coating powder of active metal consisting of Ti and/or Zr on the end face of the ceramics cylinder without heating the ceramics cylinder, in an amount of 0.1 mg/cm$^2$ to 10 mg/cm$^2$, mounting a layer of brazing filler metal on the end face of the ceramics cylinder, which have been coated with the powder of the active metal, placing the metal seal member on the layer of brazing filler metal, and heating the ceramics cylinder, the metal seal member, and the layer of brazing filler metal, thereby melting the layer of brazing filler metal and, thus, brazing the metal seal member to the open end of the ceramics cylinder.

7 Claims, 1 Drawing Sheet

METHOD OF MANUFACTURING A SEMICONDUCTOR DEVICE

CROSS-REFERENCE TO THE RELATED APPLICATIONS

The present application is a continuation-in-part application of U.S. patent application Ser. No. 176,752 filed Apr. 1, 1988 and now U.S. Pat. No. 4,917,642. The technical points disclosed in the U.S. patent application, which fall within the scope of this invention are incorporated in the present specification.

BACKGROUND OF THE INVENTION

1. Field of the Invention

The present invention relates to a method of manufacturing a power semiconductor device such as a transistor, a thyristor or a rectifier for great power. More particularly, the invention relates to an improved method of manufacturing the ceramic package of a power semiconductor device. Also, the present invention relates to a semiconductor device manufactured by this improved method.

2. Description of the Related Art

The package of a power semiconductor device is made of ceramics, for two reasons. First, ceramics withstand a very high voltage. Secondly, ceramics are more airtight than a resin, and prevents the semiconductor element sealed within the package from being oxidized and hence from deteriorating.

The ceramic package is an airtight container which comprises a hollow cylinder made of ceramics and a metal seal member closing the open end of the cylinder. Obviously, an airtight sealing must be achieved between the metal seal member, on the one hand, and the open end of the cylinder, on the other.

In order to attain airtight sealing, the end of the ceramic cylinder is metallized, using metals having high melting points. For example, powder comprising Mo, Mn, and W particles as main components is applied to the end face of the ceramic cylinder, and the cylinder is heated to 1400° to 1700° C. in a reducing atmosphere. As a result, the metals react with the ceramic, thus metallizing the end face of the cylinder. Then, a metal seal member is brazed to either metallized end face of the ceramic cylinder.

The method of assembling the ceramic package, descried above, is disadvantageous in the following respects:

First, this method can be applied to oxide ceramic only. Alumina packages have been used widely for encasing semiconductor devices. Recently, packages made of non-oxide ceramic, such as aluminum nitride and silicon carbide, which are greatly thermal conductive, are used in increasing numbers to encase semiconductor devices. There is a demand for a method of assembling ceramic packages, which can be applied not only to oxide ceramic, but also to non-oxide ceramic.

Secondly, the cost of assembling ceramic packages by the method described above is high since the ceramic cylinders must be heated to very high temperatures.

Thirdly, the metals having high melting points, such as Mo, Mn, and W, used in the method are readily oxidized. When a ceramic package made by the method are used in a high-humidity atmosphere, its metallized layers will soon be corroded, jeopardizing the airtight sealing between the ceramic cylinder and either metal seal member. Consequently, the semiconductor elements sealed within the package will be exposed to air and moisture, inevitably having their characteristics deteriorated.

SUMMARY OF THE INVENTION

It is an object of the present invention is to improve the airtightness of and corrosion resistance of the ceramic package of a semiconductor device.

It is another object of the invention to provide a method of manufacturing a semiconductor device having a package sufficiently airtight and corrosion-resistant, without applying metallization which involves in a high-temperature processing.

The inventors hereof have repeated numerous tests and extensive investigation on ceramic packages, in order to achieve the objects described above. They have found that a ceramic cylinder and a metal seal member can be brazed together at a relatively low temperature, into an airtight and corrosion-resistant ceramic package, by using active metal consisting of Ti and/or Zr. The inventors have also found that this method is applicable to not only an oxide ceramic cylinder, but also a carbide or nitride ceramic cylinder.

The objects described above can be attained by brazing a metal seal member to the end of a ceramic cylinder at a relatively low temperature, by using an active metal consisting of Ti and/or Zr.

According to a first aspect of the invention, there is provided a method of manufacturing a semiconductor device comprising a ceramic cylinder, a metal seal member closing the open end of the cylinder, a semiconductor element located within the cylinder and having electrodes, and leads or electrodes connected to the electrodes of the semiconductor element and extending from the cylinder, said method comprising the steps of:

coating powder of active metal consisting of Ti and/or Zr on the end face of the ceramic cylinder without heating the ceramic cylinder, in an amount of 0.1 mg/cm$^2$ to 10 mg/cm$^2$;

mounting a layer of brazing filler metal on the end face of the ceramic cylinder, which have been coated with the powder of the active metal;

placing the metal seal member on the layer of brazing filler metal; and heating the ceramic cylinder, the metal seal member, and the layer of brazing filler metal, thereby melting the layer of brazing filler metal and, thus, brazing the metal seal member to the open end of the ceramic cylinder.

According to a second aspect of this invention, there is provided a method of manufacturing a semiconductor device of the same type as described above, said method comprising the steps of:

mounting or depositing a layer of active metal consisting of Ti and/or Zr on the end face of the ceramic cylinder;

mounting or depositing a layer of brazing filler metal on the layer of active metal;

placing the metal seal member on the layer of brazing filler metal; and heating the ceramic cylinder, the metal seal member, the layer of active metal, and the layer of brazing filler metal, thereby melting the layer of brazing filler metal and, thus, brazing the metal seal member to the open end of the ceramic cylinder.

According to a third aspect of this invention, there is provided a method of manufacturing a semiconductor device of the same type as described above, said method comprising the steps of:

mounting or depositing a layer of brazing filler metal which contains active metal consisting of Ti and/or Zr on the end face of the ceramic cylinder;

placing the metal seal member on the layer of brazing filler metal; and heating the ceramic cylinder, the metal seal member, the layer of active metal, and the layer of brazing filler metal, thereby melting the layer of brazing filler metal and, thus, brazing the metal seal member to the open end of the ceramic cylinder.

DETAILED DESCRIPTION OF THE PREFERRED EMBODIMENTS

Figure 1:
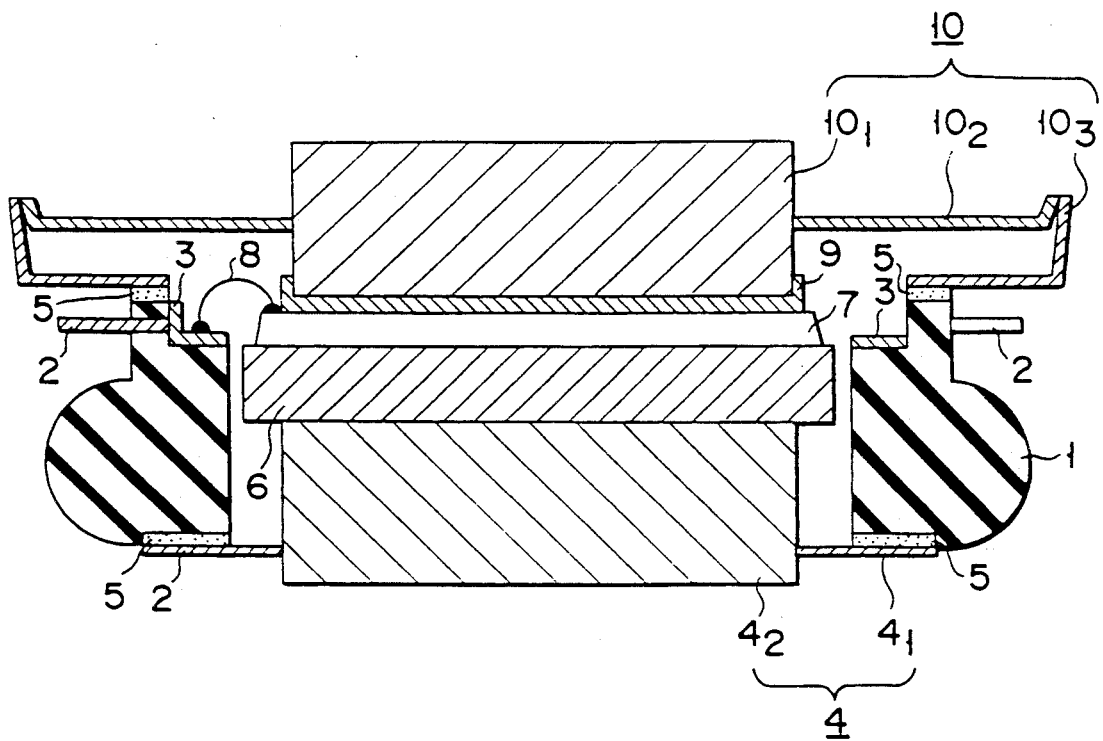
FIG. 1 is a sectional view illustrating a semiconductor device according to one embodiment of the present invention.

The present invention will now be described in detail, with reference to an embodiment. [Method of Assembling the Ceramic Package]

First, the method of assembling a ceramic package of a semiconductor device, which is the principle item of the present invention, will be described. This method is similar to the method disclosed in U.S. patent application Ser. No. 176,752 which is the parent application to the present application.

In the method according to the present invention, a layer of active metal consisting Ti and/or Zr are mounted on the open-end face of a ceramic cylinder, in order to braze a metal seal member to the end face of the cylinder. There are three methods for mounting the layer of active metal on the end face of the cylinder. It is an important characteristic of the present invention that any of these method do not employ heat treatment at high temperature for conducting metallization.

The first method is to coat powder of the active metal on the end face of the ceramic cylinder. There are two alternatives of the first method. The first alternative is to coat an organic adhesive prepared by kneading a binder and a solvent on the end face of the cylinder, and then to spray the powder of active metal onto the end face of the cylinder, thereby forming a layer of the powder thereon. The second alternative is to apply mixture prepared by kneading the active metal, an organic binder, and a solvent, onto the end face of the ceramic cylinder through a fine metal mesh. The binder and the solvent, used in the first method, can be of any types that will completely decompose and will be removed from the end face of the cylinder when they are heated in the brazing process which will be performed later. The binder is, for example, either polyvinyl alcohol or ethyl cellulose. The solvent is, for instance, ethanol or tetralin. In the first alternative of the first method, it is desirable that the metal powder have a particle size ranging from 0.1 to 10 μm; otherwise, the metal powder could not be smoothly sprayed.

In the case where the active metal consists of Ti and Zr, the mixing ratio of Ti to Zr is not limited at all. Preferably, the surface roughness of the end face of the ceramic cylinder is 0.1 to 10 μm. If the surface roughness exceeds 10 μm, there is the possibility that the metal seal member is not strongly brazed to the cylinder.

The second method is either to deposit the layer of active metal on the end face of the ceramic cylinder by means of vacuum evaporation or sputtering, or to mount a piece of active metal foil on the end face of the ceramic cylinder.

The third method is to deposit a layer of brazing filler metal containing the active metal, on the end face of the ceramic cylinder, by means of vacuum evaporation or sputtering, or to mounting a piece of foil made of the brazing filler metal, on the end face of the cylinder. The brazing filler metal is, for example, a Ti-Cu alloy having a melting point of about 880° C. or a Ti-Ag-Cu alloy having a melting point of about 780° C. Obviously, the melting point of either alloy is far lower than those of the metals used to metallize the end face of a ceramic cylinder in the prior-art method of assembling a ceramic package, and hence helps to reduce the cost of assembling a ceramic package.

After the layer of active metal have been mounted on the end face of the cylinder, by the first, second, or third method, a metal seal member is brazed to the end face of the ceramic cylinder. More specifically, if the active metal layer has been mounted by the first or second method, a layer of brazing filler metal must be placed on the active metal layer before the metal seal member is attached to the ceramic cylinder. There are two techniques of mounting the layer of brazing filler metal on the active metal layer. The first technique is to mount a foil of brazing filler metal on the active metal layer. The second technique is to deposit the filler metal layer on the active metal layer by means of either vacuum evaporation or sputtering. Preferably, the brazing filler metal is an Ag-Cu alloy, an Ag-Cu-Sn alloy, an Ag-Cu-Zn alloy, or the like. Alternatively, the foil of brazing filler metal, which is shown in FIGS. 4A and 4B and FIGS. 5A to 4C of the parent application Ser. No. 176,752, can be used.

Now that the layer of active metal and the layer of brazing filler metal are mounted on the end face of the ceramic cylinder, the metal seal member is attached to the layer of brazing filler metal, followed by being heated to a temperature higher than the melting point of the brazing filler metal in a vacuum or in a non-oxidizing atmosphere, e.g., an argon atmosphere.

While the metal seal member is being brazed to the end face of the ceramic cylinder, the active metal diffuses into the end portion of the ceramic cylinder. Hence, the metallizing of the end portion of the cylinder and the brazing of the metal seal member to the cylinder are performed at the same time. Due to the metallizing, the fused brazing filler metal wets the end face of the cylinder sufficiently. As a result, a completely airtight sealing is achieved between the ceramic cylinder and the metal seal member.

The inventors hereof have conducted an experiment, in which the powder of the above-identified active metal was coated to the surface of an alumina disc, a foil of Ag-C brazing filler metal was mounted on the metal-coated surface of the alumina disc, and the alumina disc was heated in a vacuum. It was found that the brazing filler metal melted and spread well on the disc, thus showing that the good metallization of the surface region thereof was obtained. As this fact shows, the use of the coating of the above-specified active metal serves to achieve a completely airtight sealing between the ceramic cylinder and the metal seal member, thereby to produce an airtight ceramic package of a conductor device.

In the first method, it is required that the powder of the active metal be applied in an amount of 0.1 to 10 mg/cm$^2$. If the powder is used in an amount outside this range, the end portion of the ceramic cylinder cannot be metallized enough to allow for thorough spreading of the fused brazing filler metal on the end face of the ceramic cylinder. As a result, when the active metal was coated on the end face of a ceramic cylinder in an amount falling outside said range, no complete airtight sealing was achieved between the cylinder and the metal seal member.

[Manufacture of the Semiconductor Device]

An semiconductor device (in particular, a great-power device) is sealed within the ceramic package assembled by the method described above, thereby manufacturing a semiconductor device according to the present invention. All steps for manufacturing the semiconductor device, such as die bonding and wire bonding, can be the same as those of the conventional methods of manufacturing semiconductor device, except for the step of assembling the ceramic package. It is desirable that the metal seal member be made of material whose thermal expansion coefficient is similar to that of the ceramic cylinder, so that no excessive thermal stress is applied to the cylinder in the process of brazing the metal seal member to the ceramic cylinder. The preferable materials are: Mo, W, Kovar, an alloy of Fe, Ni and Co, Invar, an alloy of Fe, Ni and Mn 42-alloy, an alloy of Fe and Ni, or Cu. A composite material comprising laminated on the layer of these metal other than Cu is more preferable.

As has been described, the method of assembling the ceramic package can be applied not only to oxide ceramic such as alumina, but also to non-oxide ceramic such as nitride ceramic (e.g., aluminum nitride) and carbide ceramic (e.g., silicon carbide). The non-oxide ceramic withstand higher voltages than the oxide ceramic. Hence, when the method of the present invention is used to brazing the metal seal member to a cylinder made of non-oxide ceramic, a semiconductor device which withstand high voltages will be manufactured. When the cylinder is made of aluminum nitride, the ceramic package can release heat with high efficiency since aluminum nitride has high thermal conductivity.

A preferred embodiment of the invention will now be described in detail, with reference to the accompanying drawings.

FIG. 1 is a sectional view illustrating a semiconductor device manufactured by the method according to the present invention. As is shown in FIG. 1, the semiconductor device has a ceramic package. The ceramic package comprises a ceramic cylinder 1. The cylinder 1 is made of either an oxide ceramic, a carbide or a nitride ceramic. The cylinder 1 has a ring formed integral with its lower-end portion. This ring, which has a semicircular cross section, reinforces the cylinder against voltage. Tubular leads 2 penetrate the wall of the upper end of the cylinder 1. Through these leads, the package is exhausted, and an inert gas introduced into the packages The leads are collapsed and closed by welding after the package is exhausted and filled with the inert gas. The cylinder 1 has a stepped portion in the inner surface of its upper-end portion, with a metallized layer 3 being formed on the stepped portion. The leads 2 are connected, at one end, to the metallized layer 3.

A first metal seal member 4 is brazed to the lower-end face of the ceramic cylinder 1, thus closing the lower end of the cylinder. The first metal seal member 4 consists of an annular seal plate 41 made of Kovar or the like and having an opening, and a lower electrode 4$_2$ made of Cu and fitted in the opening of the seal member 4$_1$. The plate 4$_1$ and the electrode 4$_2$ are welded to each other. The seal plate 4$_1$ is brazed to the ceramic cylinder 1 by the first, second or third method described above. A numeral 5 denotes a bonding layer formed by the brazing. A plate-shaped heat buffer 6, which is made of Mo, W, or the like, is mounted on the lower electrode 42. A great-power bipolar transistor element 7 is mounted on the heat buffer 6.

Figure 2:
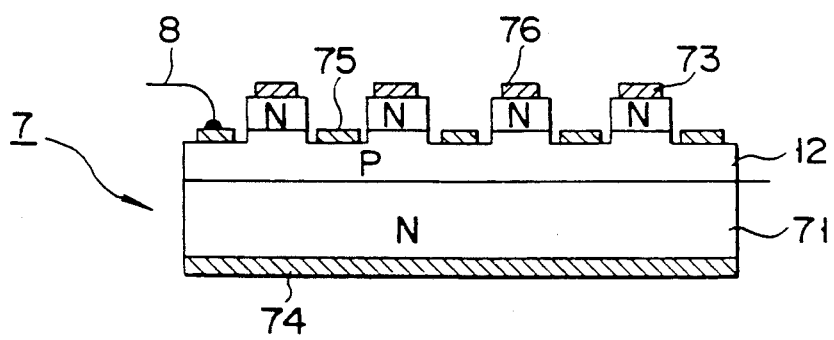
FIG. 2 is also a sectional view showing the transistor element incorporated in the semiconductor device illustrated in FIG. 1.

FIG. 2 is a sectional view illustrating the transistor element 7. As is shown in FIG. 2, the transistor element 7 comprises a collector region 71, a base region 72, a emitter region 73, a collector electrode 74, a base electrode 75, and an emitter electrode 76. The base electrode 75 is connected to the metallized layer 3 formed on the inner surface of the ceramic cylinder 1 by means of a bonding wire 8. The emitter region 73 has a continuous and complex planer shape for increasing emitter/base junction and, therefore, has high injection efficiency. The emitter region 73 are of mesa structure, as is illustrated in FIG. 2.

As FIG. 1 shows, a plate-shaped heat buffer 9 is mounted on the transistor element 7. An upper electrode 10$_1$ made of Cu is mounted on the heat buffer 9. The upper electrode 10$_1$ functions as the node of the emitter electrodes 76. The upper electrode 10$_1$ is fitted in the opening of a welded ring 10$_2$. The ring 10$_2$ is connected, at its circumference, to a seal cup 10$_3$. The seal cup 10$_3$ is brazed, at its lower end, to the upper end face of the ceramic cylinder 1 by means of a bonding layer 5 formed by the brazing described above. The upper electrode 10$_1$, the welded ring 10$_2$, and the seal cup 10$_3$ constitute a second metal seal member 10. The lower electrode 4$_2$, the heat buffer 6, the transistor element 7, the heat buffer 9, and the upper electrode 10$_1$ are pressed together with a load of about 1 ton.

The metal seal members 4 and 10 are brazed to the ceramic cylinder 1, by using the bonding layers 5 interposed therebetween. The seal members 4 and 10 and the cylinder 1, thus brazed together, forms a completely airtight and sufficiently strong sealing, as can be understood from the above related description. No metallizing layers containing much high-melting metal, such as Mo, Mn, or W, and insufficiently resistant to oxidation are interposed between the cylinder 1, on the one hand, and the seal members 4 and 10, on the other. The junction between the cylinder and the seal members remains free from corrosion even if the package is used long in a humid atmosphere. Hence, the ceramic package remains adequately airtight, thereby preserving the reliability of the the transistor element sealed within the package.

The method according to the present invention can be applied not only to a great-power bipolar transistor element, but also to other great-power semiconductor elements such as a gate-turnoff thyristor. In case of need, the metal seal members 4 and 10 can be fastened to the ceramic cylinder 1 by means of such endface-bonding as is disclosed in U.S. patent application Ser. No. 176,752 (the parent application).

Several examples of the method of manufacturing a semiconductor device, according to this invention, will now be described.

EXAMPLE 1

A semiconductor device of the same type as is shown in FIG. 1 was manufactured, by assembling a ceramic package in the same way as in the conventional method, except that the metal seal members 4 and 10 were fastened to the ceramic cylinder 1 made of alumina, in the following specific manner.

First, Ti powder having a particle size of 10 μm was mixed with ethyl cellulose-terpineol solution, and the resultant mixture was kneaded, thereby preparing a paste. The paste was coated on the upper and lower end faces of the ceramic cylinder 1 so that Ti is applied in an amount of 1 mg/cm$^2$. Then, a foil of silver brazing filler metal (72 wt%Ag-Cu), 50 μm thick, was mounted on either end face of the cylinder 1. Next, the seal plate $4_1$ and the seal cup $10_3$, both made of Kovar, were placed on the layers of brazing filler metal, respectively. The resultant structure was then heated at 850° C. for 10 minutes in an atmosphere of $2 \times 10^{-5}$ Torr. The seal plate $4_1$ and the seal cup $10_3$ were thereby brazed to the ceramic cylinder 1.

Thereafter, the semiconductor device was assembled in the same way as in the conventional method. To be specific, the lower electrode $4_2$ was fitted into the opening of the seal plate $4_1$ and welded thereto. Then, the heat buffer 6 was mounted on the lower electrode $4_2$, and the transistor element 7 was mounted on the heat buffer 6. Further, the base electrode 75 of the transistor element 7 was connected to the metallized layer 3 formed on the inner surface of the ceramic cylinder 1 by means of the bonding wire 8 Next the heat buffer 9 was mounted on the element 7, and the upper electrode $10_1$ was placed on the heat buffer 9. The weld ring $10_2$ was welded to the upper electrode $10_1$ and also to the seal cup $10_3$. As a result, a ceramic package was made. Then, this package was exhausted through tubular leads 2, and $N_2$ gas was introduced into the package through the tubular leads 2. The leads 2 were then collapsed and closed by welding.

The semiconductor device, thus manufactured was tested for a possible leakage of gas at the junction between the ceramic cylinder 1, on the one hand, and the metal seal members $4_1$ and $10_3$, on the other. The He-leakage at the junction was recorded at $10^{-10}$ Torr·l/s or less. Thus, the ceramic package was found to be sufficiently airtight.

Furthermore, the semiconductor device was left for 100 hour in an atmosphere wherein the humidity and temperature were maintained at 90% and 90° C., to see whether or not the junction between the cylinder 1 and the seal members $4_1$ and $10_3$ would be oxidized, in accordance with changes in the color of the junction, the leakage of He at the junction, and the weight increase of the package. The same test was conducted on a comparative device which had been made by the same method, except that both end faces of the ceramic cylinder 1 were metallized with a high-melting metal as in the conventional method. The test showed that the semiconductor device made by the method of the invention was oxidized at said junction, much less than the comparative semiconductor device.

EXAMPLE 2

Also in this example, a cylinder 1 made of alumina was used. Ti powder and Zr powder, both having a particle size of 10 μm, were mixed in the mixing ratio of 9:1. The powder mixture was mixed with ethyl cellulose-terpineol solution, and the resultant mixture was kneaded, thereby preparing a paste. This paste was coated on the upper and lower end faces of the ceramic cylinder 1 in the same amount as in Example 1, i.e., 1 mg/cm$^2$ of the active metal. Thereafter, the necessary components were fastened together in the same way as in Example 1, thereby forming a semiconductor device of the structure illustrated in FIG. 1.

This device was put to the same leakage test as the device of Example 1. The He-leakage at the junction between the ceramic cylinder 1, on the one hand, and the metal seal members $4_1$ and $10_3$, on the other, was recorded at $10^{-10}$ Torr.l/s or less. This indicated that the ceramic package was sufficiently airtight.

Moreover, the semiconductor device was put to the same reliability test as the device of Example 1. The test showed that the semiconductor device of Example 2 was oxidized at the junction between the cylinder 1 and the metal seal members $4_1$ and $10_3$, much less than the comparative semiconductor device.

EXAMPLE 3

In this example, too, a cylinder 1 made of alumina was used. The same past that was used in Example 1 was coated on the upper and lower end faces of the ceramic cylinder 1 in the same amount as in Example 1, i.e., 1 mg/cm$^2$ of Ti. Thereafter, the necessary components were fastened together in the same way as in Example 1, thereby forming a semiconductor device of the structure illustrated in FIG. 1. The semiconductor device was identical to those of Examples 1 and 2, except that use was made of a seal plate $4_1$ and a seal cup $10_3$, both made of Cu, not Kovar.

This device was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Further, the semiconductor device was put to the same reliability test as the devices of Example 1. The test revealed that the semiconductor device of Example 3 was oxidized at the junction between the cylinder 1 and the metal seal members $4_1$ and $10_3$, much less than the comparative semiconductor device.

EXAMPLE 4

In this example, a cylinder 1 made of aluminum nitride was used. Except for this point, a semiconductor device was manufactured, exactly in the same way as in Example 1.

The device was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Further, the semiconductor device was put to the same reliability test as the device of Example 1. The test revealed that the semiconductor device of Example 3 was oxidized at the junction between the cylinder 1 and the metal seal members $4_1$ and $10_3$, far less than the comparative semiconductor device.

Moreover, the ceramic packages of the devices of Examples 1 and 4 were put to a withstand voltage test. The package of the device of Example 4, which was made mainly of aluminum nitride, had a withstand voltage of about 14 kV/mm, whereas that of the device of Example 1, which was made of alumina, had 10 kV/mm.

EXAMPLE 5

Also in this example, a cylinder 1 made of aluminum nitride was used. As in Example 2, Ti powder and Zr powder, both having a particle size of 10 μm, were mixed in the mixing ratio 9:1. The powder mixture was mixed with cellulose-terpineol solution, and the resultant mixture was kneaded, thereby preparing a paste. This paste was coated on the upper and lower end faces of the ceramic cylinder 1 in the same amount as in Example 1, i.e., 1 mg/cm$^2$ of the active metal. Thereafter, the necessary components were fastened together in the same way as in Example 1, thereby forming a semiconductor device of the structure illustrated in FIG. 1.

The device was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of this semiconductor device was sufficiently airtight.

Further, the semiconductor device was put to the same reliability test as the device of Example 1. The device of Example 5 was found to be oxidized at the junction between the cylinder 1 and the metal seal members $4_1$ and $10_3$, much less than the comparative semiconductor device.

Moreover, the ceramic packages of the devices of Examples 2 and 5 were put to a withstand voltage test. The package of the device of Example 5, which was made mainly of aluminum nitride, had a withstand voltage of about 14 kV/mm, whereas that of the device of Example 2, which was made of alumina, had 10 kV/mm.

EXAMPLE 6

A cylinder 1 made of silicon carbide was used. Except for this point, a semiconductor device of the structure shown in FIG. 1 was manufactured, exactly in the same way as in Example 1.

The device was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Further, the semiconductor device was put to the sam reliability test as the device of Example 1. The test showed that the semiconductor device of Example 6 was oxidized at the junction between the cylinder 1 and the metal seal members $4_1$ and $10_3$, far less than the comparative semiconductor device.

Moreover, the ceramic packages of the devices of Examples 1 and 4 were put to a withstand voltage test. The package of the device of Example 6, which was made mainly of silicon carbide, had a withstand voltage of about 13 kV/mm, whereas that of the device of Example 1, which was made of alumina, had 10 kV/mm.

EXAMPLE 7

As in Example 1, a cylinder 1 made of alumina was used. Ti was deposited on the upper and lower end faces of the cylinder 1 by means of vacuum evaporation, thus forming a Ti layer having a thickness of 1 μm on either end face of the ceramic cylinder 1. The same method as Example 1, except for this point, was performed, thereby manufacturing a semiconductor device of the structure shown in FIG. 1.

The device, thus manufactured, was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Further, the semiconductor device was put to the same reliability test as the device of Example 1. The test showed that the semiconductor device of Example 7 was oxidized at the junction between the cylinder 1 and the metal seal members $4_1$ and $10_3$, far less than the comparative semiconductor device.

EXAMPLE 8

Use was made of a cylinder 1 made of aluminum nitride. As in Example 7, Ti was deposited on the upper and lower end faces of the cylinder 1 by means of vacuum evaporation, thus forming a Ti layer having a thickness of 1 μm on either end face of the ceramic cylinder 1. The same method as Example 1, except for this point, was performed, thereby manufacturing a semiconductor device of the structure shown in FIG. 1.

The device, thus manufactured, was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Further, the semiconductor device was put to the same reliability test as the device of Example 1. The test revealed that the semiconductor device of Example 8 was oxidized at the junction between the cylinder 1 and the metal seal members $4_1$ and $10_3$, much less than the comparative semiconductor device.

Still further, the ceramic packages of the devices of Examples 7 and 8 were put to a withstand voltage test. The package of the device of Example 8, which was made mainly of aluminum nitride, had a withstand voltage of about 13 kV/mm, whereas that of the device of Example 7, which was made of alumina, had 10 kV/mm.

EXAMPLE 9

As in Example 1, use was made of a cylinder 1 made of alumina. Foil of Ti, 3 μm thick, was laid on the upper and lower end faces of the cylinder 1. Further, use was made of a seal plate $4_1$ and a seal cup $10_3$, both made of Cu, not Kovar. The same method as Example 1, except for these points, was performed, thereby manufacturing a semiconductor device of the structure shown in FIG. 1.

The device, thus manufactured, was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Moreover, the semiconductor device was put to the same reliability test as the device of Example 1. The test revealed that the semiconductor device of Example 9 was oxidized at the junction between the cylinder 1 and the metal seal members $4_1$ and $10_3$, much less than the comparative semiconductor device.

EXAMPLE 10

As in Example 1, a cylinder 1 made of alumina was used. Two foils of brazing filler metal containing Ti, i.e., 3 wt%Ti-70Ag-Cu alloy, having a thickness of 50 μm, were mounted on the upper and lower end faces of the cylinder 1, respectively. Further, use was made of a seal plate $4_1$ and a seal cup $10_3$, both made of Cu, not Kovar. The same method as Example 1, except for these points, was performed, manufacturing a semiconductor device of the structure shown in FIG. 1.

The semiconductor device was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Moreover, the semiconductor device was put to the same reliability test as the device of Example 1. The test revealed that the semiconductor device of Example 10 was oxidized at the junction between the cylinder 1 and the metal seal members $4_1$ and $10_3$, much less than the comparative semiconductor device.

EXAMPLE 11

In this Example, use was made of an aluminum nitride cylinder 1. As in Example 10, two foils of brazing filler metal containing Ti, i.e., 3w%Ti-70Ag-Cu alloy, having a thickness of 50 μm, were mounted on the upper and lower end faces of the cylinder 1, respectively. As in Example 1, use was made of a seal plate $4_1$ and a seal cup $10_3$, both made of Kovar. The same method as Example 1, except for these points, was performed, manufacturing a semiconductor device of the structure shown in FIG. 1.

The semiconductor device was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Moreover, the semiconductor device was put to the same reliability test as the device of Example 1. The test revealed that the semiconductor device of Example 11 was oxidized at the junction between the cylinder 1 and the metal seal members $4_1$ and $10_3$, much less than the comparative semiconductor device.

Still further, the ceramic packages of the devices of Examples 10 and 11 were put to a withstand voltage test. The package of the device of Example 11, which was made mainly of aluminum nitride, had a withstand voltage of about 14 kV/mm, whereas that of the device of Example 11, which was made of alumina, had 10 kV/mm.

EXAMPLE 12

In this Example, use was made of an aluminum nitride cylinder 1. Two foils of brazing filler metal containing Zr, i.e., 3w%Zr-70Ag-Cu alloy, having a thickness of 50 μm, were mounted on the upper and lower end faces of the cylinder 1, respectively. Use was made of a seal plate $4_1$ and a seal cup $10_3$, both made of Cu, not Kovar. The same method as Example 1, except for these points, was performed, manufacturing a semiconductor device of the structure shown in FIG. 1.

The semiconductor device was put to the same leakage test as the device of Example 1. The He-leakage at the junction between the ceramic cylinder 1, on the one hand, and the metal seal members $4_1$ and $10_3$, on the other, was found to be $10^{-10}$ Torr.l/s or less. Hence, the ceramic package of the semiconductor device was sufficiently airtight.

Moreover, the semiconductor device was put to the same reliability test as the device of Example 1. The test revealed that the semiconductor device of Example 12 was oxidized at the junction between the cylinder 1 and the metal seal members $4_1$ and $10_3$, much less than the comparative semiconductor device.

Still further, the ceramic packages of the devices of Examples 10 and 12 were put to a withstand voltage test. The package of the device of Example 12, which was made mainly of aluminum nitride, had a withstand voltage of about 14 kV/mm, whereas that of the device of Example 10, which was made of alumina, had 10 kV/mm.

What is claimed is:

1. A method of manufacturing an airtight semiconductor device comprising a ceramic cylinder, a metal seal member closing an open end of the cylinder, a semiconductor element located within the cylinder and having electrodes, and leads or electrodes connected to the electrodes of the semiconductor element and extending from the cylinder, said method comprising the steps of:

coating powder of active metal consisting of Ti and/or Zr on the end face of said ceramic cylinder without heating said ceramic cylinder, in an amount of 0.1 mg/cm² to 10 mg/cm²;

mounting a layer of brazing filler metal on the end face of said ceramic cylinder, which has been coated with the powder of the active metal;

placing said metal seal member selected from the group consisting of Mo, W, an alloy of Fe and Ni, and alloy of Fe, Ni and Co, an alloy of Fe, Ni and Mn, and Cu composites thereof on said layer of brazing filler metal; and heating said ceramic cylinder, said metal seal member, and said layer of brazing filler metal, thereby melting said layer of brazing filler metal and, thus, brazing said metal seal member to the open end of said ceramic cylinder.

2. A method of manufacturing a semiconductor device comprising a ceramic cylinder, a metal seal member closing an open end of the cylinder, a semiconductor element located within the cylinder and having electrodes, and leads or electrodes connected to the electrodes of the semiconductor element and extending from the cylinder, said method comprising the steps of:

mounting or depositing a layer of active metal consisting of Ti and/or Zr on the end face of said ceramic cylinder;

mounting or depositing a layer of brazing filler metal on said layer of active metal;

placing said metal seal member on said layer of brazing filler metal; and heating said ceramic cylinder, said metal seal member, said layer of active metal and said layer of brazing filler metal, thereby melting said layer of brazing filler metal and, thus, brazing said metal seal member to the open ends of said ceramic cylinder.

3. The method according to claim 2, wherein said layer of the active metal is formed by means of either vacuum evaporation or sputtering.

4. The method according to claim 2, wherein said layer of the active metal is a sheet of foil.

5. A method of manufacturing of semiconductor device comprising a ceramic cylinder, a metal seal member closing an open end of the cylinder, a semiconductor element located within the cylinder and having electrodes, and leads or electrodes element and extending from the cylinder, said method comprising the steps of:

mounting or depositing a layer of brazing filler metal which contains active metal consisting of Ti and/or Zr on the end face of said ceramic cylinder;

placing said metal seal member on said layer of brazing filler metal; and heating said ceramic cylinder, said metal seal member, and said layer of brazing filler metal, thereby melting said layer of brazing filler metal and, thus, brazing said metal seal member to the open end of said ceramic cylinder.

6. The method according to claim 5, wherein said layer of the brazing filler metal is formed by means of either vacuum evaporation or sputtering.

7. The method according to claim 5, wherein said layer of the brazing filler metal is a sheet of foil.

* * * * *